(12) United States Patent
Iino et al.

(10) Patent No.: US 7,268,386 B2
(45) Date of Patent: Sep. 11, 2007

(54) NONVOLATILE SEMICONDUCTOR MEMORY AND A FABRICATION METHOD FOR THE SAME

(75) Inventors: Naohisa Iino, Kanagawa-ken (JP); Atsushi Murakawa, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 114 days.

(21) Appl. No.: 10/983,058

(22) Filed: Nov. 8, 2004

(65) Prior Publication Data
US 2005/0224862 A1    Oct. 13, 2005

(30) Foreign Application Priority Data
Apr. 8, 2004    (JP) .............................. 2004-114201

(51) Int. Cl.
*H01L 29/788* (2006.01)
(52) U.S. Cl. ................. 257/315; 257/316; 257/317
(58) Field of Classification Search ............... 257/315, 257/317, 316
See application file for complete search history.

(56) References Cited

U.S. PATENT DOCUMENTS

| | | | | |
|---|---|---|---|---|
| 6,483,146 B2 * | 11/2002 | Lee et al. | ..................... | 257/317 |
| 6,573,139 B2 * | 6/2003 | Lee et al. | ..................... | 438/257 |
| 6,583,008 B2 * | 6/2003 | Lee et al. | ..................... | 438/257 |

FOREIGN PATENT DOCUMENTS

JP        2002-83884        3/2002

OTHER PUBLICATIONS

Wei-Hua Liu, et al., "A 2-Transistor Source-select (2TS) Flash EEPROM for 1.8V-Only Applications", The 15th Annual IEEE Non-Volatile Semiconductor Memory Workshop, 4.1, pp. 1-3, Feb. 9-12, 1997.

* cited by examiner

*Primary Examiner*—Douglas M. Menz
(74) *Attorney, Agent, or Firm*—Oblon, Spivak, McClelland, Maier & Neustadt, P.C.

(57) ABSTRACT

A nonvolatile semiconductor memory including: a plurality of stripe-shaped active regions extending in a bit line direction; device isolation regions having tops arranged at a location higher than the active regions; a plurality of word lines and select gate lines intersecting with the bit line direction; and memory cell transistors arranged at the intersections of the active regions and the word lines via gate insulator films, including floating gate electrodes formed on the device isolation regions and gate insulator films on the active regions, and isolated on the device isolation regions, control gate electrodes arranged on the floating gate electrodes, and inter-gate insulator films arranged between the control gate electrodes and the floating gate electrodes; wherein, the thickness of the floating gate electrodes on the active regions and a maximum thickness of the floating gate electrodes on the device isolation regions are substantially the same, and steps are provided at the edges of the floating gate electrodes isolated on the device isolation regions.

17 Claims, 16 Drawing Sheets

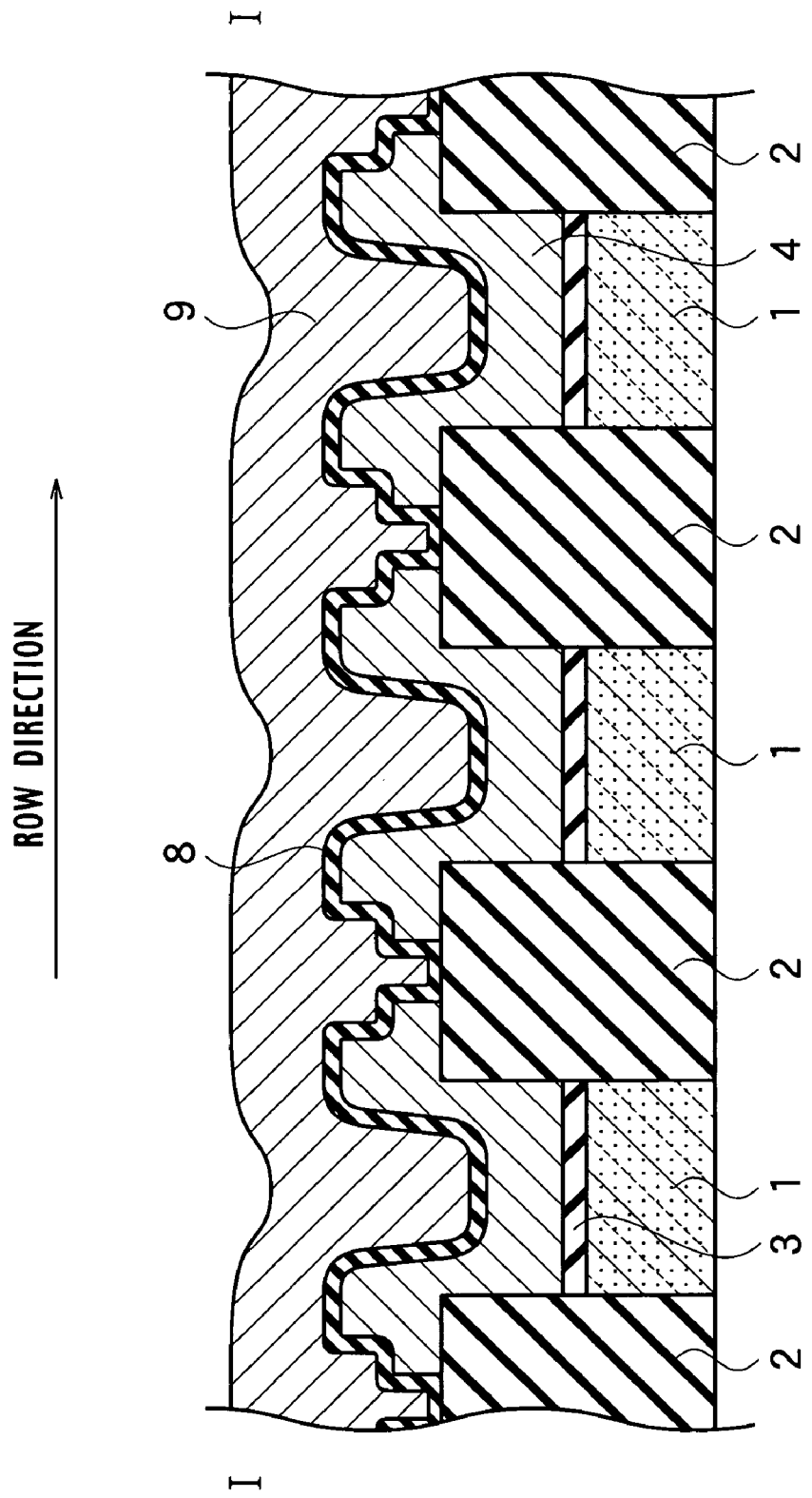

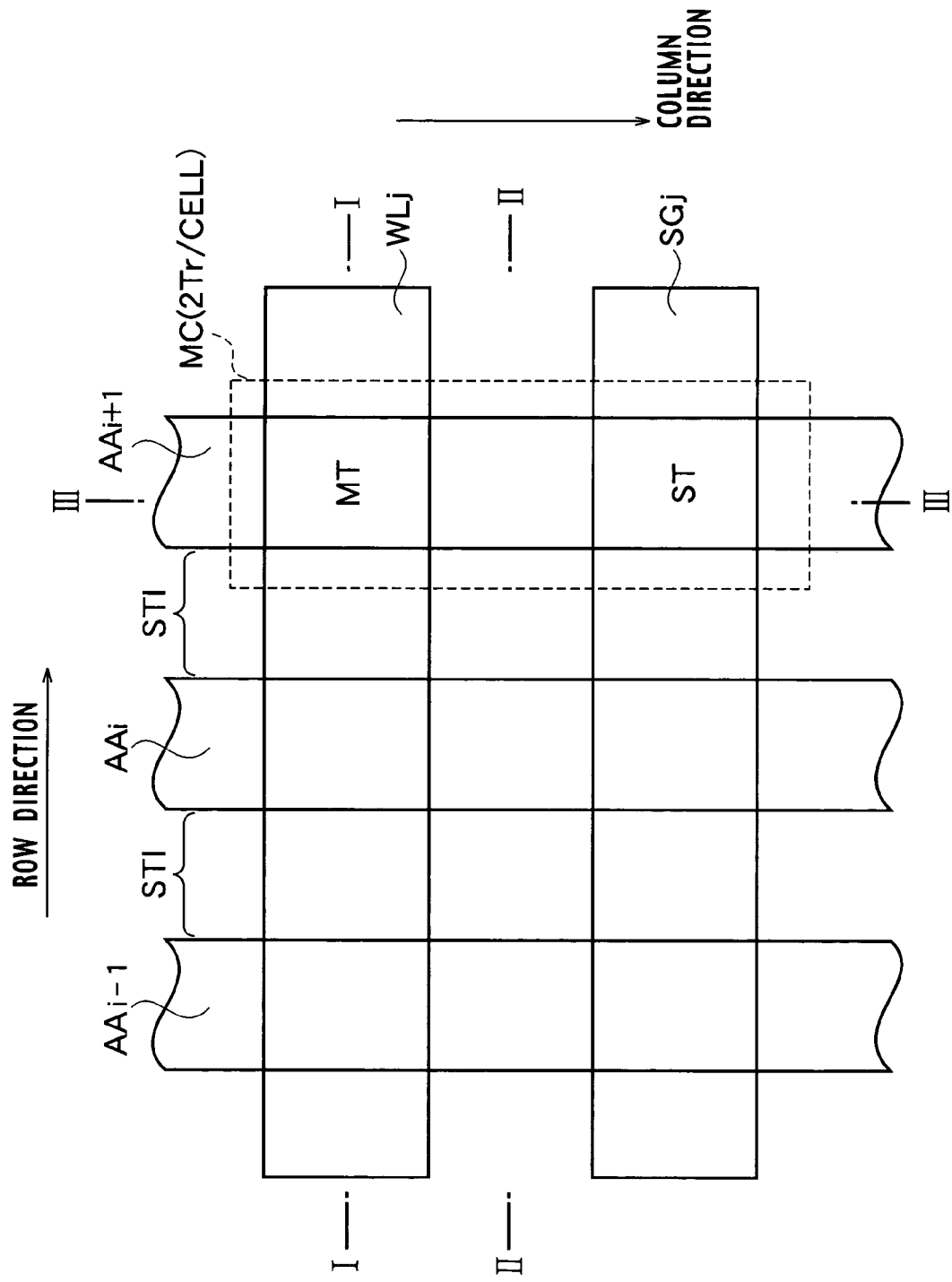

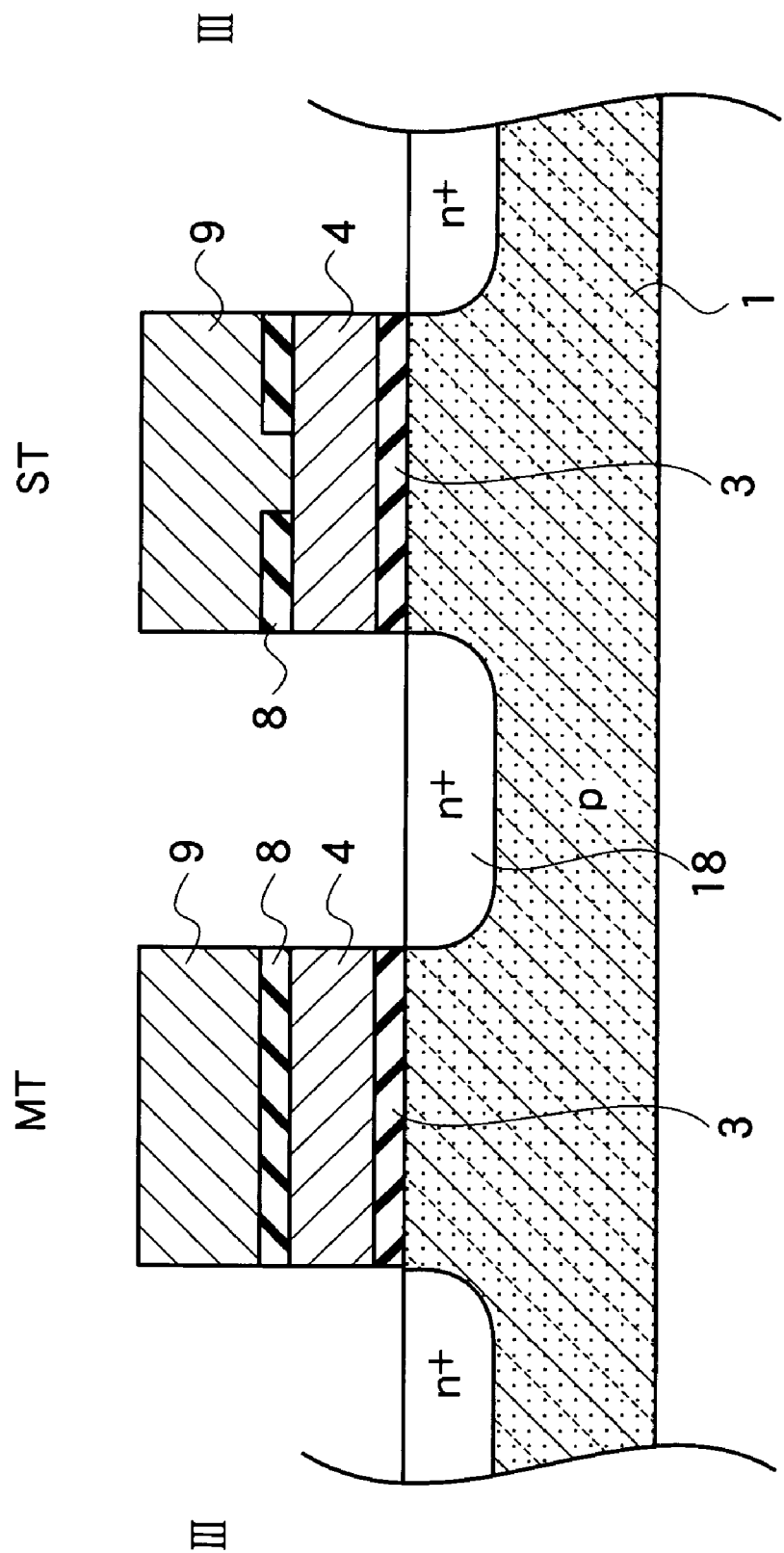

MAXIMUM VERTICAL THICKNESS K
OF INTER-GATE INSULATOR FILM

MAXIMUM LAYER THICKNESS F
OF STEP COVERAGE FORM AT EDGE
OF FLOATING GATE ELECTRODE

NONVOLATILE SEMICONDUCTOR MEMORY AND A FABRICATION METHOD FOR THE SAME

CROSS REFERRENCE TO RELATED APPLICATIONS

This application is based upon and claims the benefit of priority from prior Japanese Patent Applications P2004-114201 filed on Apr. 8, 2004; the entire contents of which are incorporated by reference herein.

BACKGROUND OF THE INVENTION

1. Field of the Invention

The present invention relates to a nonvolatile semiconductor memory. It is particularly related to a nonvolatile semiconductor memory characteristic of a floating gate electrode edge structure in a memory cell transistor with a two-layer gate electrode transistor structure, and a fabrication method for the same.

2. Description of the Related Art

Conventionally, a NOR flash memory and a NAND flash memory are known and widely used as nonvolatile semiconductor memories.

In recent years, a flash memory having the advantages of both a NOR flash memory and a NAND flash memory has been proposed (see Wei-Hua Liu, "A 2-Transistor Source-select (2TS) Flash EEPROM for 1.8V-Only Application", Non-Volatile Semiconductor Memory Workshop 4.1, 1997, for example). This flash memory comprises memory cells, each including two MOS transistors. In such memory cell, one of the MOS transistors serving as a nonvolatile memory unit has a structure including a control gate and a floating gate, and is connected to a bit line. The other MOS transistor is connected to a source line, and is used for memory cell selection.

With an exemplary two-layer gate electrode transistor structure in which a floating gate electrode and a control gate electrode are stacked, isolation of the floating gate electrode is carried out through a slitting process. For example, a proposed slitting process is disclosed in Japanese Patent Application Laid-open 2002-83884.

With this two-layer gate electrode isolation process, the layer thickness of the floating gate electrode on a device isolation region is nearly the same as the vertical thickness (height) of an inter-gate insulator film. Thus, in the case of processing, under a condition such as low selectivity relative to the floating gate electrode, a sidewall insulator film is etched, and at the same time the floating gate electrode is also etched. This process makes it difficult to completely remove the inter-gate insulator film, and to prepare process margins for securing the remaining film of the floating gate electrode.

On the other hand, in order to increase the selectivity for the above processing, increased processing control such as usage of an exclusive highly selective gas chamber and prevention of etching stoppage due to a reaction product is required.

As a result, fabricating high performance cell/peripheral transistors through a simple process is difficult.

SUMMARY OF THE INVENTION

A first aspect of the present invention inheres in a nonvolatile semiconductor memory including: a plurality of stripe-shaped active regions extending in a bit line direction; device isolation regions having tops thereof arranged at a location higher than the active regions; a plurality of word lines and select gate lines intersecting with the bit line direction; and memory cell transistors arranged at the intersections of the active regions and the word lines via gate insulator films, including floating gate electrodes formed on the device isolation regions and gate insulator films on the active regions, and isolated on the device isolation regions, control gate electrodes arranged on the floating gate electrodes, and inter-gate insulator films arranged between the control gate electrodes and the floating gate electrodes; wherein, the thickness of the floating gate electrodes on the active regions and a maximum thickness of the floating gate electrodes on the device isolation regions are substantially the same, and steps are provided at the edges of the floating gate electrodes isolated on the device isolation regions.

A second aspect of the present invention inheres in a nonvolatile semiconductor memory fabrication method including: depositing floating gate electrodes on the surface of a structure of gate insulator films, the gate insulators films formed between device isolation regions and on active regions; depositing a first mask material on the floating gate electrodes, and forming a resist pattern on the first mask material: etching the first mask material so as to provide a remaining layer thickness of the floating gate electrodes to be approximately half of the thickness of the floating gate electrodes; depositing a second mask material on the first mask material, and then forming sidewalls of the second mask material on sidewalls of the first mask material; etching the floating gate electrodes using the first and the second mask material as a mask; and depositing an inter-gate insulator film and depositing control gate electrodes on the inter-gate insulator film.

A third aspect of the present invention inheres in a nonvolatile semiconductor memory fabrication method including: depositing floating gate electrodes on the surface of a structure of gate insulator films, the gate insulator films formed between device isolation regions and on active regions; depositing a first mask material on the floating gate electrodes, and forming a resist pattern on the first mask material: etching the first mask material, and performing a thermal oxidation treatment, forming a thermal oxide film on the entire surface of the device; depositing a second mask material on the first mask material, and forming sidewalls of the second mask material on sidewalls of the first mask material; etching the floating gate electrodes using the first and the second mask material as a mask; removing the first and the second mask material and the thermal oxide film; and depositing an inter-gate insulator film on the entire surface of the device, and depositing control gate electrodes on the inter-gate insulator film.

BRIEF DESCRIPTION OF DRAWINGS

FIG. 1 is a schematic device cross-sectional diagram of nonvolatile semiconductor memory according to a first embodiment of the present invention;

FIG. 2 is a schematic aerial pattern diagram of the nonvolatile semiconductor memory according to the first embodiment of the present invention;

FIG. 4 is a schematic device cross-sectional diagram of the nonvolatile semiconductor memory, according to the first embodiment of the present invention, cut along the line III-III of FIG. 2;

DETAILED DESCRIPTION OF THE INVENTION

Figures 3A, 3B:
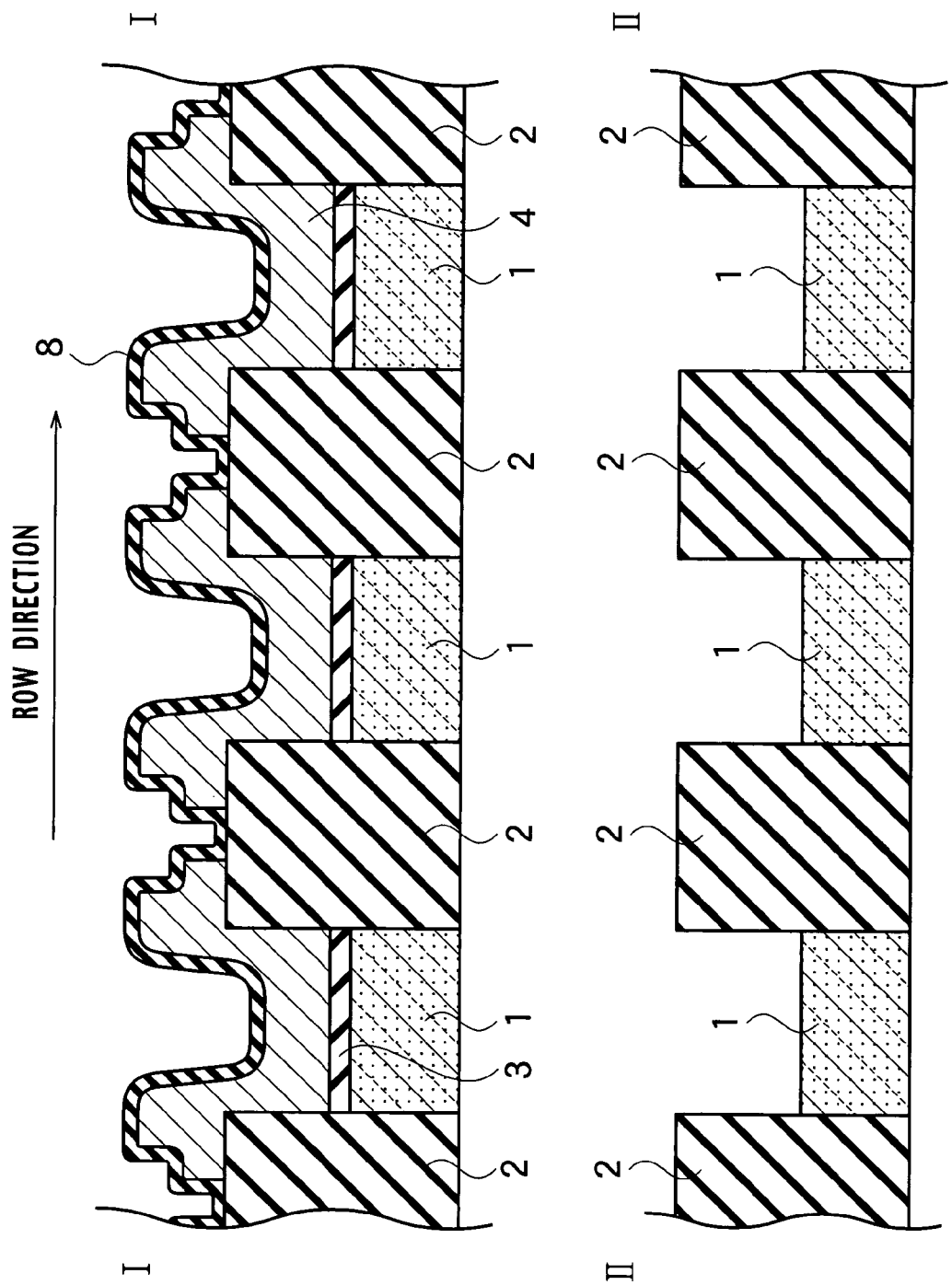
FIG. 3A is a schematic device cross-sectional diagram of the nonvolatile semiconductor memory, according to the first embodiment of the present invention, cut along the line I-I of FIG. 2.
FIG. 3B is a schematic device cross-sectional diagram of the nonvolatile semiconductor memory, according to the first embodiment of the present invention, cut along the line II-II of FIG. 2.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order not to obscure the present invention in unnecessary detail.

Nonvolatile semiconductor memories with a two-layer gate electrode transistor structure according to the present invention and a fabrication method for the same have merits of solving a problem relating to process margins due to making steps at the edges of floating gate electrodes when carrying out an isolation process for the floating gate electrodes of two-layer gate transistors. This is particularly due to carrying out an isolation process for the floating gate electrodes after device isolation; securing process margins in the fabrication process; improving coupling; and easily combining high-performance peripheral elements.

Making the floating gate electrodes with a two-layer electrode transistor structure with a step approximately half its height allows a nonvolatile semiconductor memory to have the maximum vertical thickness of insulator films at the floating gate electrode edges so as to be reduced to half of the maximum vertical thickness of insulator films, facilitate removal of the insulator films without change in characteristics, provides process margins in the fabrication process; improves coupling; and provides ease of combining high-performance peripheral elements.

First through fourth embodiments of the present invention are described forthwith while referencing the drawings. The same or similar symbols are given to the same or similar parts throughout the appended drawings. However, it should be noted that the drawings are merely schematics that the relationship between thickness and planar dimension and the ratio of respective layer thicknesses and the like differ from those of the actual invention. Accordingly, specific thicknesses and dimensions should be determined while considering the following description. Furthermore, parts with differing dimensions and/or differing ratios may be included among the drawings.

In addition, the first through fourth embodiments given forthwith illustrate devices and methods for embodying the technical idea of the present invention, and that technical idea of the present invention is not limited to the following materials, shapes, structures, arrangements or the like. The technical idea of the present invention may be modified within the scope of the appended claims.

FIRST EMBODIMENT (Basic Device Structure)

The structure of a nonvolatile semiconductor device according to the first embodiment of the present invention is shown in FIGS. 1 through 4. FIG. 1 is a schematic device cross-sectional diagram; FIG. 2 is a schematic aerial pattern diagram; FIGS. 3A and 3B are schematic device cross-sectional diagrams cut along the lines I-I and II-II of FIG. 2, respectively; and FIG. 4 is a schematic device cross-sectional diagram cut along the line III-III of FIG. 2. The top plan view pattern shown in FIG. 2 represents a basic memory cell structure of a two-transistor memory cell MC in which a select transistor ST is serially connected to a single memory cell transistor MT.

The serial connection between the memory cell transistor MT and the select transistor ST in the two-transistor memory cell MC is implemented using source/drain diffusion layers 18 in active regions $AA_{i-1}$, $AA_i$, $AA_{i+1}$ . . . formed in a semiconductor substrate 1, as shown in FIG. 4. In addition, the structure of the memory cell transistor MT and the select transistor ST, as shown in FIG. 4, basically has a transistor structure with the two-layer gate electrode structure. In the select transistor ST, the two-layer gate electrode structure is short-circuited.

Note that even with a NAND memory cell structure or a NOR memory cell structure, the top plan view pattern is basically the same as in FIG. 2.

The nonvolatile semiconductor device according to the first embodiment of the present invention, as shown in FIGS. 1 through 4, includes multiple active regions shown in FIG. 2 drawing by reference $AA_{i-1}$, $AA_i$, $AA_{i+1}$, . . . , which are arranged on the semiconductor substrate 1 and extend in stripe-shaped form along the bit line BL direction. Device isolation regions (STIs) 2 are arranged extending in stripe-shaped forms along the bit line BL direction between each of the active regions $AA_{i-1}$, $AA_i$, $AA_{i+1}$, . . . , and parallel thereto and the tops of which are positioned to be higher than the active regions; multiple word lines $WL_j$, . . . , and select gate lines $SG_j$, . . . , which extend along the word line WL direction orthogonal to the bit line BL direction and intersect the multiple active regions $AA_{i-1}$, $AA_i$, $AA_{i+1}$, . . . , and the device isolation regions (STIs) 2. A memory cell transistor MT has a two-layer gate electrode transistor structure configured by floating gate electrodes 4 arranged on the intersections of the active regions $AA_{i-1}$, $AA_i$, $AA_{i+1}$, . . . , and the word lines $WL_j$ via insulator films 3. The floating gate electrodes are made of the same film on the gate insulator films 3 and the device isolation regions 2 on the semiconductor substrate 1. The floating gate electrodes are isolated on the device isolation regions 2. Control gate electrodes 9 are arranged on the floating gate electrodes 4, and inter-gate insulator films 8. The inter-gate insulator films 8 are arranged between the control gate electrodes 9 and the floating gate electrodes 4. The minimum layer thickness of the floating gate electrodes 4 on the semiconductor substrate 1 and the maximum layer thickness of the floating gate electrodes 4 on the device isolation regions 2 are nearly the same, and the edges of the floating gate electrodes 4 that are isolated on the device isolation regions 2 have a step structure.

Alternatively, the nonvolatile semiconductor memory may have steps formed on the edges of the floating gate electrodes 4 so that the minimum layer thickness of the floating gate electrodes 4 on the semiconductor substrate 1 can be nearly the same as the maximum layer thickness of floating gate electrodes 4 on the device isolation regions 2. The thickness of the vertical thickness of the inter-gate insulator films 8, in contact with the floating gate electrodes 4, at the edges thereof are isolated on the device isolation regions 2 and can be approximately half of the maximum layer thickness of the floating gate electrodes 4 on the device isolation regions 2.

Alternatively, the nonvolatile semiconductor memory may have steps at the edges of the floating gate electrodes 4, which are isolated on the device isolation regions 2. A length x of each floating gate electrode 4 extending in a direction parallel to the semiconductor substrate 1 and parallel to the word line WL is greater than a layer thickness y of the inter-gate insulator films 8.

Alternatively, the nonvolatile semiconductor memory may have a structure in which: the inter-gate insulator films 8 are made of a single layer of either a silicon oxide or a silicon nitride, or multiple stacked films thereof. The gate insulator films 3 may be made of a silicon oxide. The floating gate electrodes 4 and the control gate electrodes 9 may be made of a polysilicon.

The nonvolatile semiconductor memory fabrication method according to the first embodiment of the present invention has a memory cell structure formed by the device isolation regions 2. Furthermore, that fabrication process is a typical process due to formation of steps at the edges of the floating gate electrodes 4 on the device isolation regions 2; however, a comparative example of the nonvolatile semiconductor memory fabrication method of the present invention, as shown in FIGS. 5 through 11 and FIG. 24A, is described before description of the fabrication method according to the first embodiment of the present invention.

COMPARATIVE EXAMPLE

In a comparative example of a two-layer gate electrode transistor structure in which the floating gate electrode 4 and the control gate electrode 9 are stacked, isolation of the floating gate electrode 4 is carried out by a slitting process.

Figure 24A:
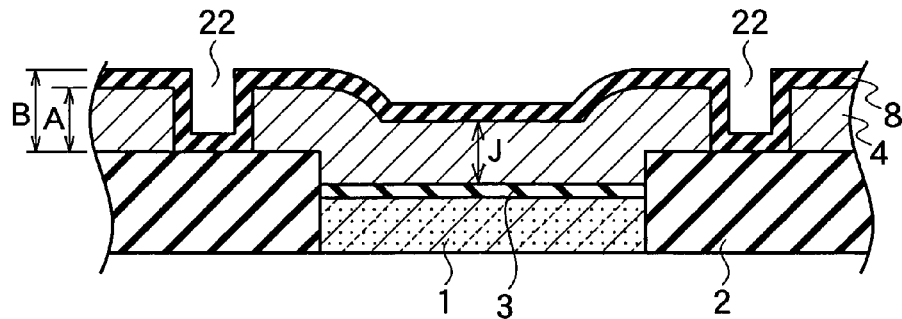
FIG. 24A is a schematic diagram describing a maximum layer thickness A of a floating gate electrode upon a device isolation region, a vertical thickness B of an inter-gate insulator film, and a minimum layer thickness J of a floating gate electrode upon a semiconductor substrate, in a structure according to the comparative example of the present invention.

Such two-layer gate electrode transistor, as shown in FIG. 24A, has a structure in which: the floating gate electrodes 4 are isolated by slits 22 on the device isolation regions 2, and an inter-gate insulator film 8 is disposed below the control gate electrode 9 located over the floating gate electrodes.

In FIG. 24A, the maximum layer thickness of the floating gate electrodes 4 on the device isolation regions 2 is defined as A. The minimum layer thickness of the floating gate electrodes 4 on the semiconductor substrate 1 is defined as J, and the vertical thickness of the inter-gate insulator films 8 is defined as B.

Next, coupling will be described. Assuming the silicon oxide film capacitance beneath the floating gate electrodes 4 as Ctox, and the inter-gate capacitance as Cip, coupling ratio Cr can be simply calculated by $$Cr = Cip/(Cip + Ctox) \quad (1)$$

In other words, coupling influences the surface area of the inter-gate silicon oxide films existing between the floating gate electrodes 4 and the control gate electrodes 9. Formation of silicon oxide films also on the sidewalls of the floating gate electrodes 4, due to isolating the floating gate electrodes 4 with the slits 22, allows increase of the surface area of the silicon oxide films between the floating gate electrodes 4 and the control gate electrodes 9, and improves in coupling.

Figure 5:
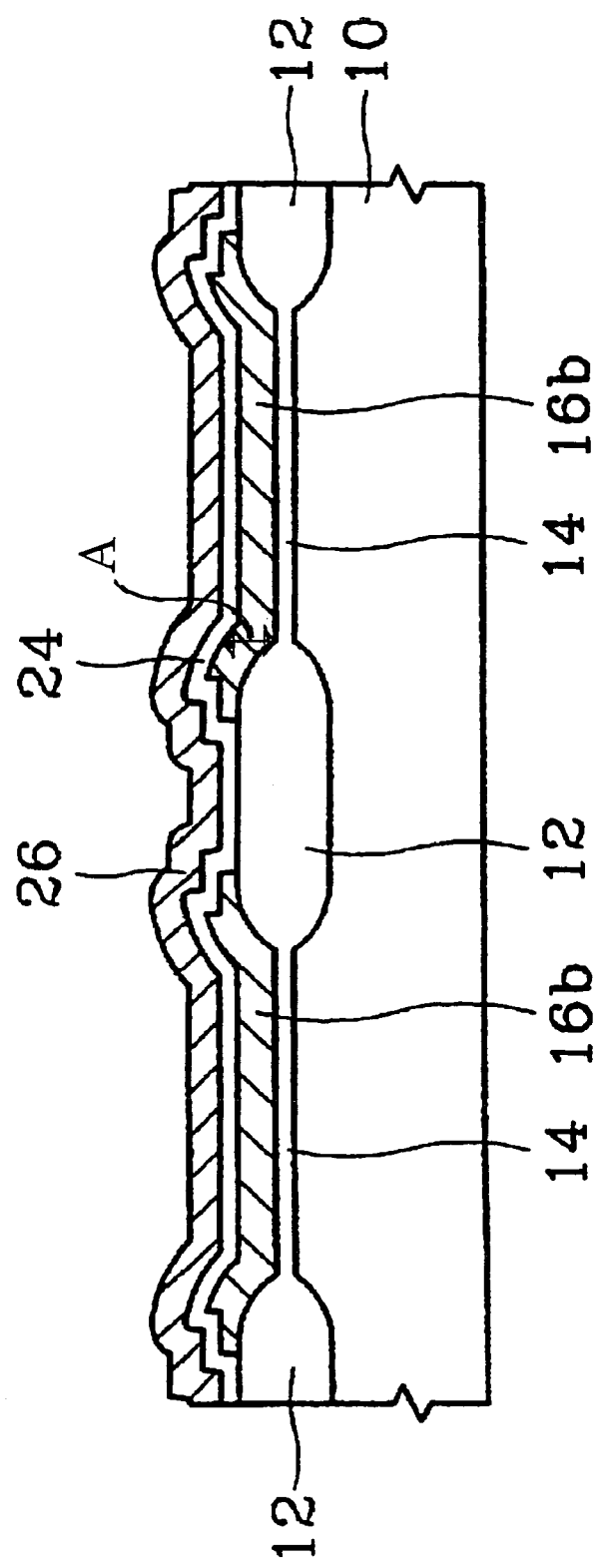
FIG. 5 is a schematic device cross-sectional diagram for describing a step of a nonvolatile semiconductor memory fabrication method according to a comparative example of the present invention.

As shown in FIG. 5, a floating gate electrode 4 is deposited in a structure where a gate insulator film 3 is formed on the semiconductor substrate 1 as an active region sandwiched between the device isolation regions 2.

Figure 6:
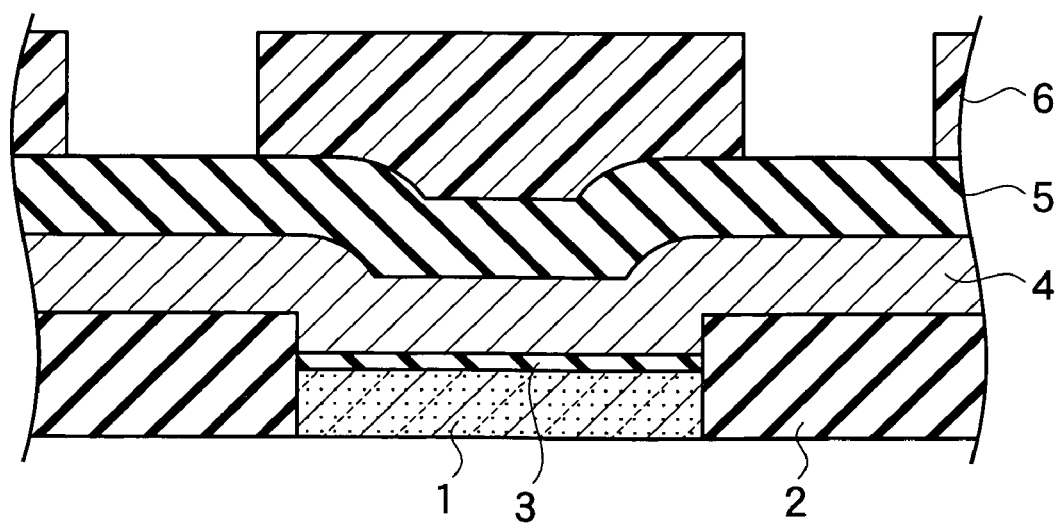
FIG. 6 is a schematic device cross-sectional diagram for describing a step of the nonvolatile semiconductor memory fabrication method according to the comparative example of the present invention.

As shown in FIG. 6, a first mask material 5 is deposited on the floating gate electrode 4, and on the first mask material 5 a resist pattern 6 is formed through lithography for forming slits in the floating gate electrode 4.

Figure 7:
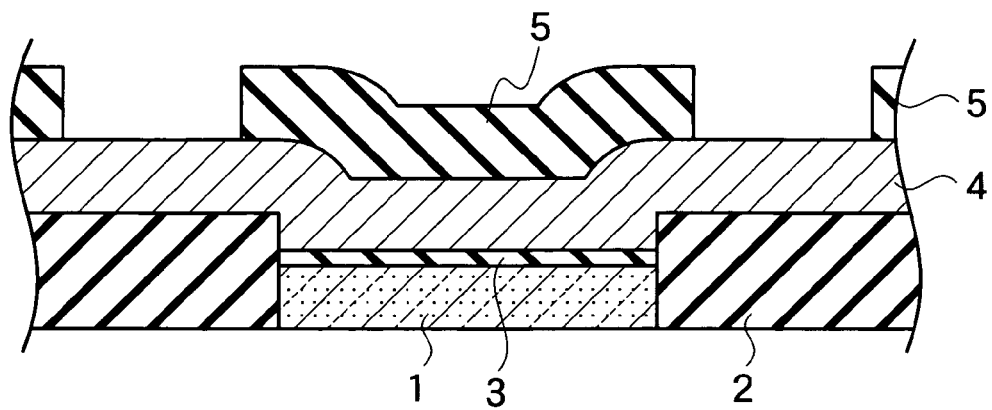
FIG. 7 is a schematic device cross-sectional diagram for describing a step of the nonvolatile semiconductor memory fabrication method according to the comparative example of the present invention.

As shown in FIG. 7, the first mask material 5 is then etched using the resist pattern 6 as a mask. Once the processing is finished, the resist pattern 6 is removed.

Figure 8:
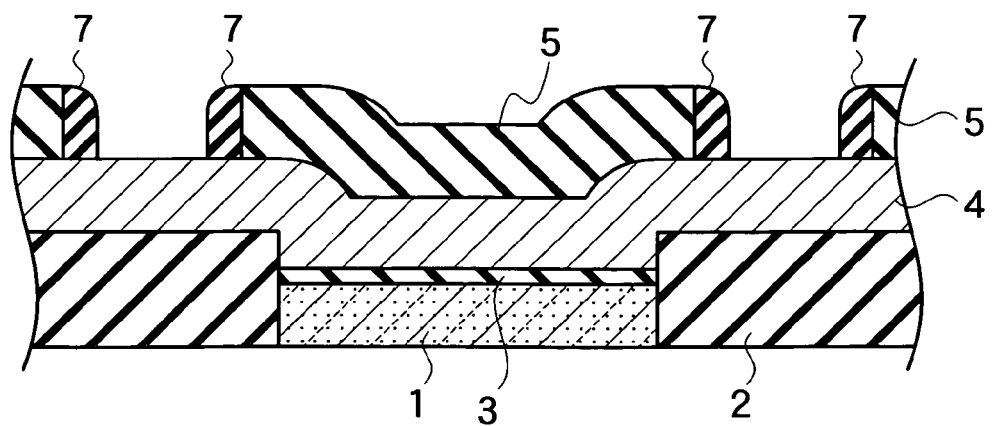
FIG. 8 is a schematic device cross-sectional diagram for describing a step of the nonvolatile semiconductor memory fabrication method according to the comparative example of the present invention.

Sidewalls are formed for miniaturization. After a second mask material 7 is stacked on the first mask material 5 as shown in FIG. 8, it is etched so as to form sidewalls of the second mask material 7 on the sidewalls of the first mask material 5.

Figure 9:
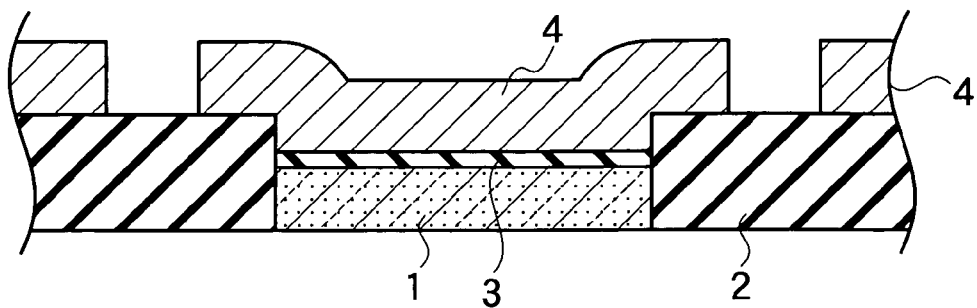
FIG. 9 is a schematic device cross-sectional diagram for describing a step of the nonvolatile semiconductor memory fabrication method according to the comparative example of the present invention.

As shown in FIG. 9, the floating gate electrode 4 is then etched using the first mask material 5 and the second mask material 7 as a mask. Once the processing is finished, the first mask material 5 and the second mask material 7 are removed.

Figure 10:
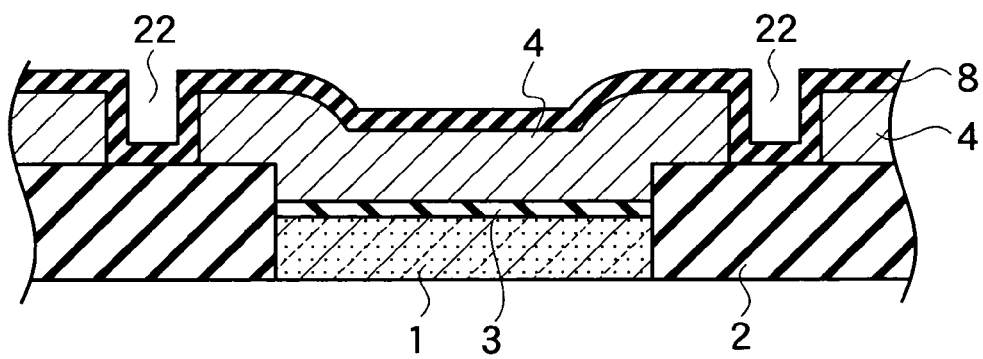
FIG. 10 is a schematic device cross-sectional diagram for describing a step of the nonvolatile semiconductor memory fabrication method according to the comparative example of the present invention.

An inter-gate insulator film 8 is deposited as shown in FIG. 10.

Figure 11:
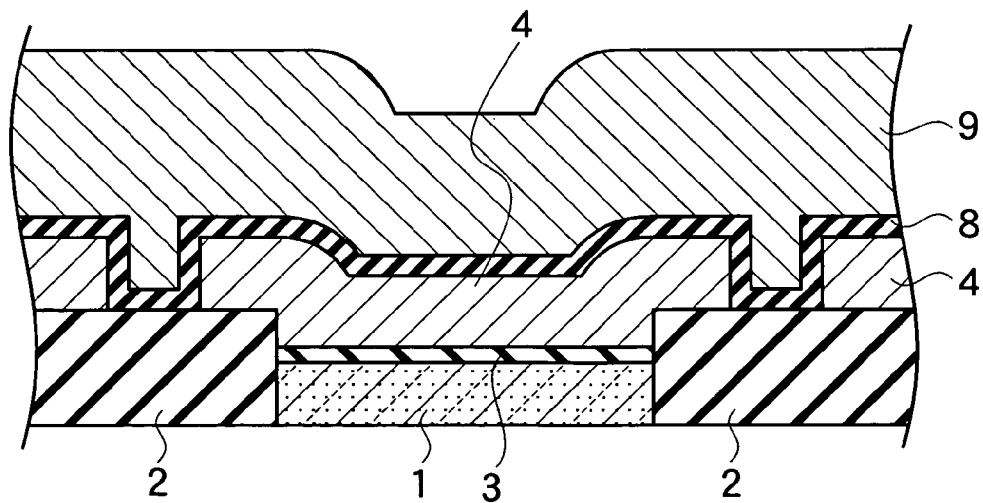
FIG. 11 is a schematic device cross-sectional diagram for describing a step of the nonvolatile semiconductor memory fabrication method according to the comparative example of the present invention.

A control gate insulator electrode 9 is deposited as shown in FIG. 11. After deposition, a mask pattern is formed on the control gate electrode 9 through lithography, and an isolation process is then carried out forming two-layer gate electrodes.

In this two-layer gate electrode isolation process, as shown in FIG. 24A, the maximum layer thickness A of the floating gate electrodes 4 on the device isolation regions 2 and the minimum layer thickness J of the floating gate electrode 4 on the semiconductor substrate 1 are nearly the same as the vertical thickness B of the inter-gate insulator film 8. Thus, in the case of process condition such as low selectivity relative to the floating gate electrode, a sidewall insulator film is etched, and at the same time the floating gate electrode 4 is also etched; this makes it difficult to completely remove the inter-gate insulator film 8, and to prepare process margins for securing the remnant film of the floating gate electrode 4.

(Fabrication Method)

The nonvolatile semiconductor memory fabrication method according to the first embodiment of the present invention differs from the above comparative example in that steps are formed at the edges of the floating gate electrodes 4 on the device isolation regions 2, as shown in FIGS. 12 through 16.

As shown in FIG. 6, with a structure where the gate insulator film 3 is formed on a semiconductor substrate 1 as an active region surrounded by the device isolation regions 2, the floating gate electrode 4 is deposited, the first mask material 5 is deposited on the floating gate electrode 4, and a resist pattern 6 is formed on the first mask material 5 through lithography. Up to this point the method is the same as that of the comparative example.

Figure 12:
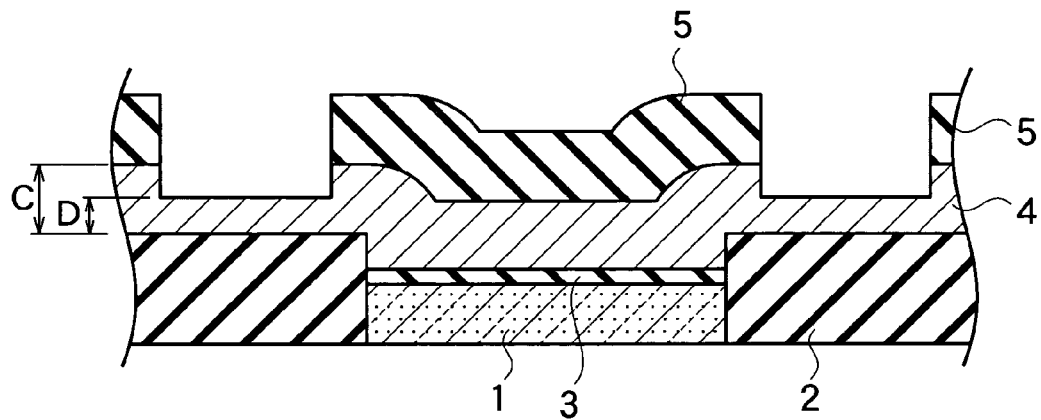
FIG. 12 is a schematic device cross-sectional diagram for describing a step of a nonvolatile semiconductor memory fabrication method according to the first embodiment of the present invention.

As shown in FIG. 12, the first mask material 5 and the floating gate electrode 4 are etched using the resist pattern 6 as a mask. With this etching, the layer thickness of the unprocessed portions of the floating gate electrode 4 is identified as C, and the remaining layer thickness after etching processing of the floating gate electrode 4 is identified as D. The remaining layer thickness D of the floating gate electrode 4 is determined so as to be approximately half the value of the thickness of C. Once the processing is finished, the resist pattern 6 is removed.

Figure 13:
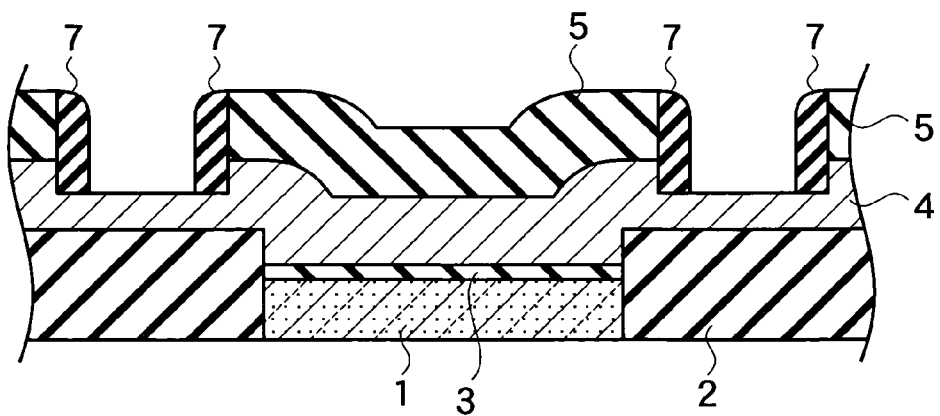
FIG. 13 is a schematic device cross-sectional diagram for describing a step of the nonvolatile semiconductor memory fabrication method according to the first embodiment of the present invention.

After a second mask material 7 is stacked on the first mask material 5 as shown in FIG. 13, it is etched so as to form sidewalls of the second mask material 7 on the sidewalls of the first mask material 5.

Figure 14:
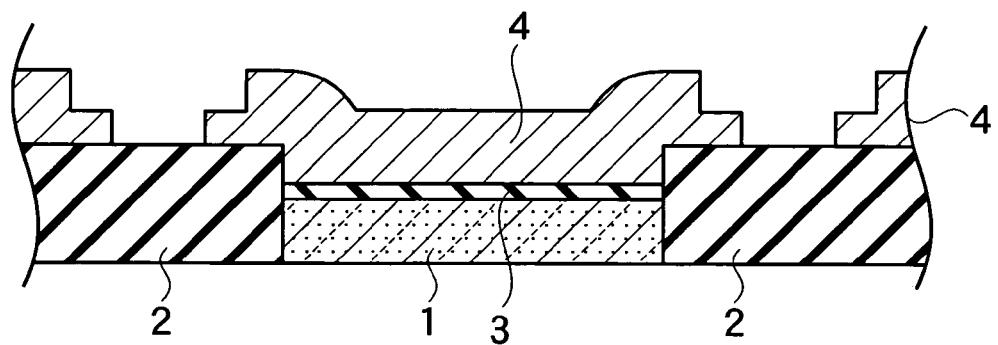
FIG. 14 is a schematic device cross-sectional diagram for describing a step of the nonvolatile semiconductor memory fabrication method according to the first embodiment of the present invention.

As shown in FIG. 14, the floating gate electrode 4 is then etched using the first mask material 5 and the second mask material 7 as a mask. Once the processing is finished, the first mask material 5 and the second mask material 7 are removed.

Figure 15:
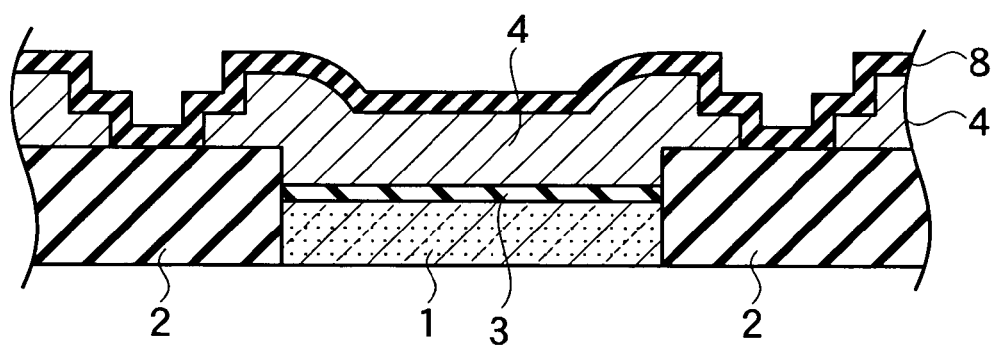
FIG. 15 is a schematic device cross-sectional diagram for describing a step of the nonvolatile semiconductor memory fabrication method according to the first embodiment of the present invention.

An inter-gate insulator film 8 is deposited as shown in FIG. 15.

Figure 16:
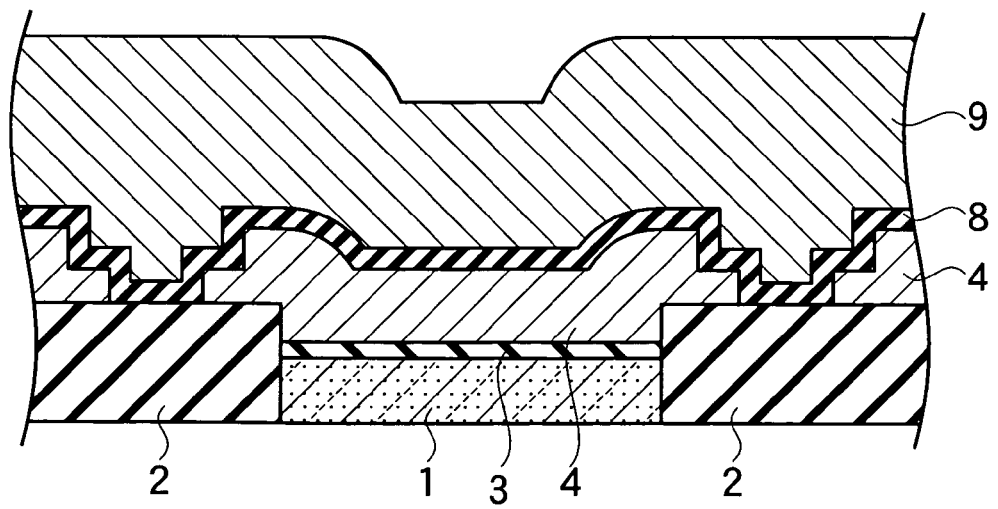
FIG. 16 is a schematic device cross-sectional diagram for describing a step of the nonvolatile semiconductor memory fabrication method according to the first embodiment of the present invention.

A control gate insulator electrode 9 is deposited as shown in FIG. 16.

Figure 24B:
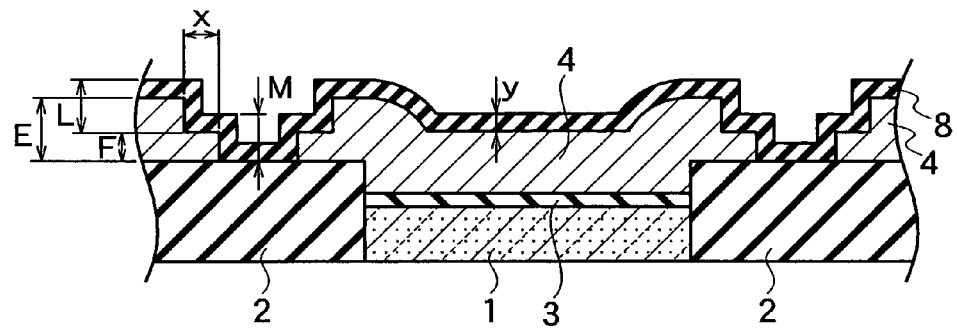
FIG. 24B is a schematic diagram for describing a maximum layer thickness E of a floating gate electrode upon a device isolation region, and a maximum layer thickness F of steps at the edges of the floating gate electrodes, in a structure according to embodiments of the present invention.
Figure 24C:
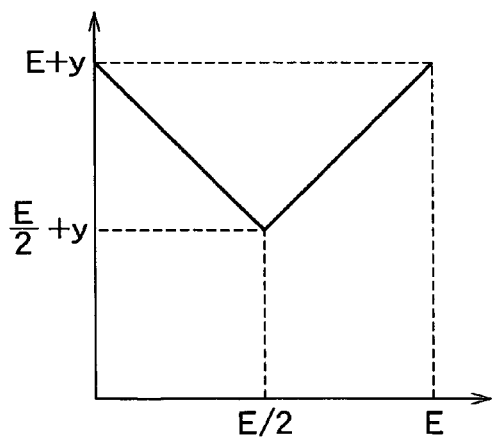
FIG. 24C is a diagram showing the relationship between a maximum vertical thickness K of an inter-gate insulator film (8) and a maximum layer thickness F of steps at the edges of the floating gate electrodes 4, in a structure according to the embodiments of the present invention.

The structure of the nonvolatile semiconductor memory according to the first embodiment has the following characteristics. As shown in FIGS. 24B and 24C, in the structure including steps formed at the edges of the floating gate electrodes 4, when denoting the maximum layer thickness of the floating gate electrode 4 on the device isolation regions 2 as E, the maximum vertical thickness of the inter-gate insulator film 8 as K, and the maximum layer thickness step portions at the edges of the floating gate electrode 4 as F, and when $$F = E/2 \quad (2)$$

the maximum vertical thickness K of the inter-gate insulator film 8 has a minimum value of E/2+y.

Making the maximum vertical thickness K of the inter-gate insulator film 8 small allows increase in the process margins for the isolation process for the two-layer gate electrodes. Note that the maximum vertical thickness K of the inter-gate insulator film 8 corresponds to the larger of vertical thickness L or M of the inter-gate insulator film 8 shown in FIG. 24B.

Even by changing the structure of the comparative example of FIG. 24A to be to be the same as the nonvolatile semiconductor device according to the first embodiment shown in FIG. 24B, the contact surface area between the floating gate electrode 4 and the inter-gate insulator film 8 does not change. Thus, there is no influence on the transistor characteristics determined by the contact surface area.

Furthermore, the contact surface area does not change even if the maximum layer thickness F of the steps at the edges of the floating gate electrodes 4 varies due to unstable processing.

SECOND EMBODIMENT (Basic Device Structure)

The structure of a nonvolatile semiconductor device according to the second embodiment of the present invention is shown in FIGS. 1 through 4, as with the first embodiment. In other words, it includes the structure of the schematic device cross-sectional diagram of FIG. 1; the structure of the schematic top plan view pattern diagram of FIG. 2; the structures of the schematic device cross-sectional diagrams cut along the lines I-I and II-II of FIG. 2, respectively, as shown in FIGS. 3A and 3B; and the structure of the schematic device cross-sectional diagram cut along the line III-III of FIG. 2, as shown in FIG. 4. The top plan view pattern shown in FIG. 2 including a basic memory cell structure two-transistor memory cells in which a select transistor ST is serially connected to single memory cell transistor MT is also the same. The top plan view pattern with this connection relationship is substantially the same as that in FIG. 2 in principle, even if it is of other NAND memory cell or NOR memory cell structures made up via source/drain diffusion layers 18 in the active regions $AA_{i-1}$, $AA_i$, $AA_{i+1}$, . . . , formed in the semiconductor substrate 1, as shown in FIG. 4.

The nonvolatile semiconductor memory fabrication method according to the second embodiment of the present invention for forming the memory cell structure after formation of the device isolation regions 2 is the same as the first embodiment. That fabrication process is a typical process due to formation of the steps at the edges of the floating gate electrodes 4 on the device isolation regions 2; however, the fabrication method is particularly different from the first embodiment.

(Fabrication Method)

A nonvolatile semiconductor memory fabrication method according to the second embodiment of the present invention is described forthwith.

Figure 17:
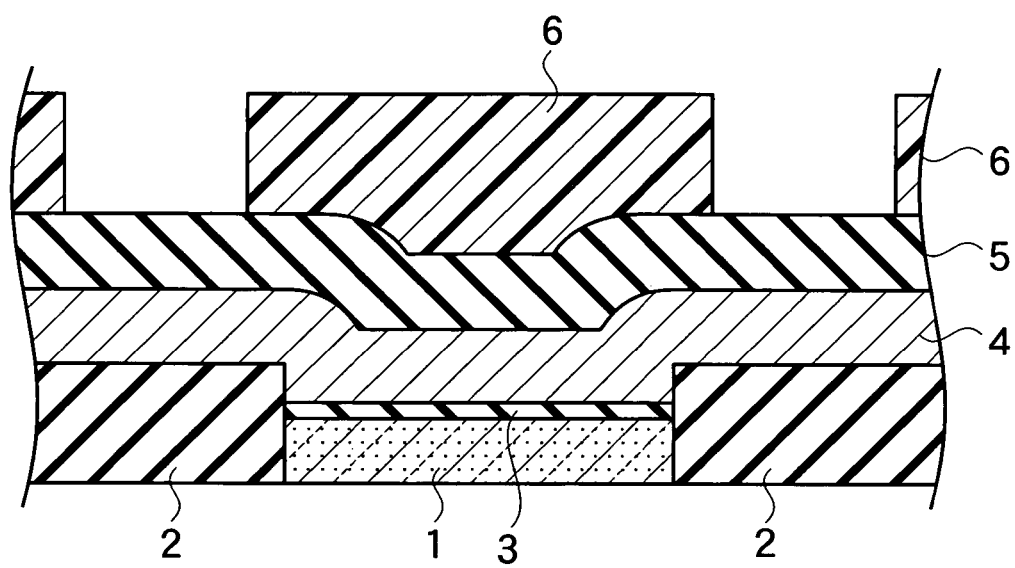
FIG. 17 is a schematic device cross-sectional diagram for describing a step of a nonvolatile semiconductor memory fabrication method according to a second embodiment of the present invention.

As shown in FIG. 17, with a structure where a gate insulator film 3 is formed on a semiconductor substrate 1 as an active region between the device isolation regions 2, a floating gate electrode 4 is deposited. A first mask material 5 is deposited on the floating gate electrode 4, and a resist pattern 6 is formed on the first mask material 5 through lithography.

Figure 18:
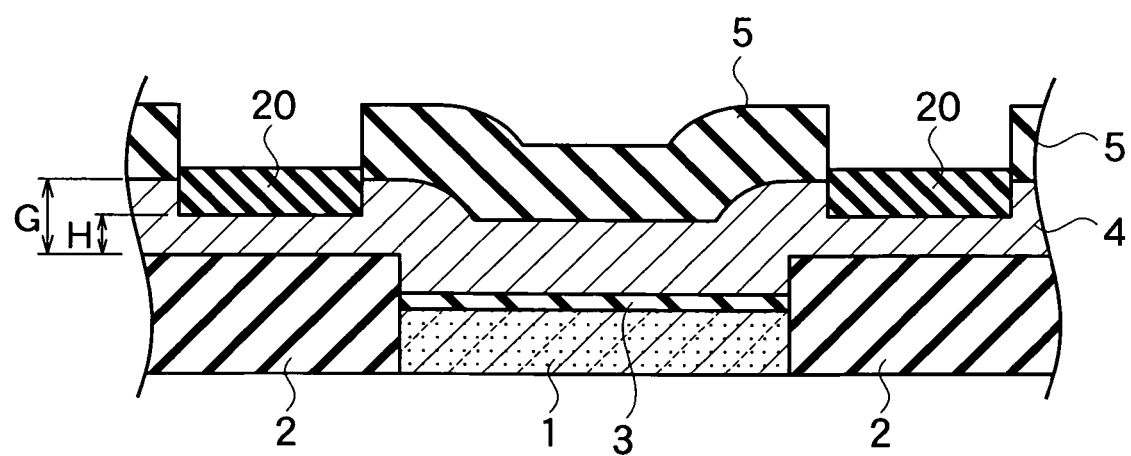
FIG. 18 is a schematic device cross-sectional diagram for describing a step of the nonvolatile semiconductor memory fabrication method according to the second embodiment of the present invention.

As shown in FIG. 18, the first mask material 5 and the floating gate electrode 4 are etched using the resist pattern 6 as a mask. Once the processing is finished, the resist pattern 6 is removed. After the resist pattern 6 is removed, thermal oxidation treatment is carried out. At this time, when the maximum layer thickness of the floating gate electrode 4 on the device isolation regions 2 is denoted as G, and the maximum layer thickness of the floating gate electrode 4 on the device isolation regions 2 beneath the thermal oxide films 20 as H, a thermal oxidation condition is set so that H is approximately half of G.

Figure 19:
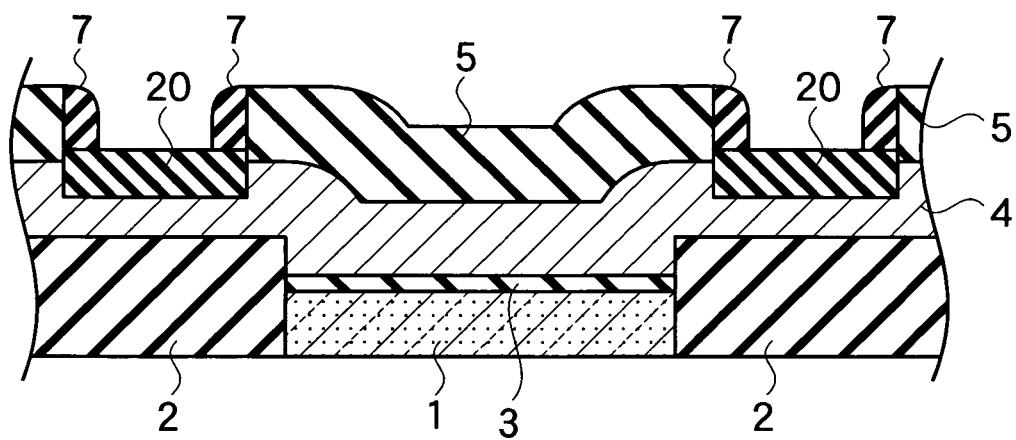
FIG. 19 is a schematic device cross-sectional diagram for describing a step of the nonvolatile semiconductor memory fabrication method according to the second embodiment of the present invention.

After a second mask material 7 is stacked on the first mask material 5 as shown in FIG. 19, it is etched so as to form sidewalls of the second mask material 7 on the sidewalls of the first mask material 5.

Figure 20:
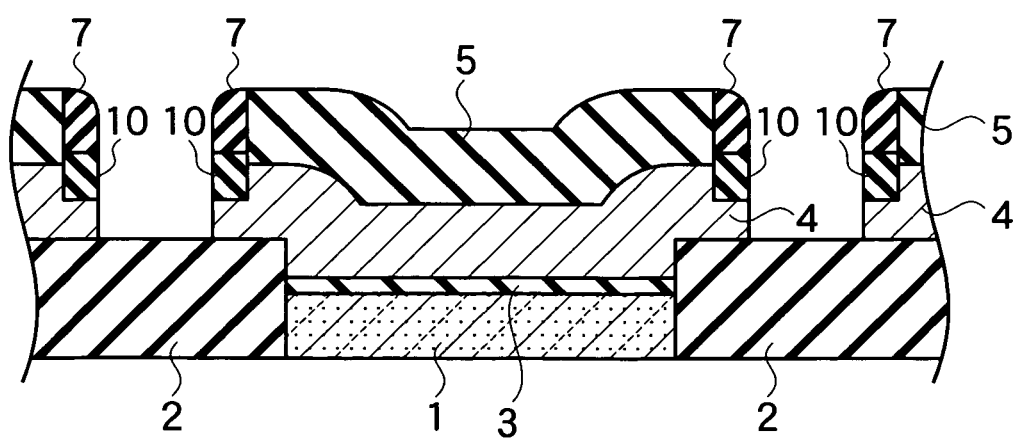
FIG. 20 is a schematic device cross-sectional diagram for describing a step of the nonvolatile semiconductor memory fabrication method according to the second embodiment of the present invention.

As shown in FIG. 20, the floating gate electrode 4 is then etched using the first mask material 5 and the second mask material 7 as a mask.

Figure 21:
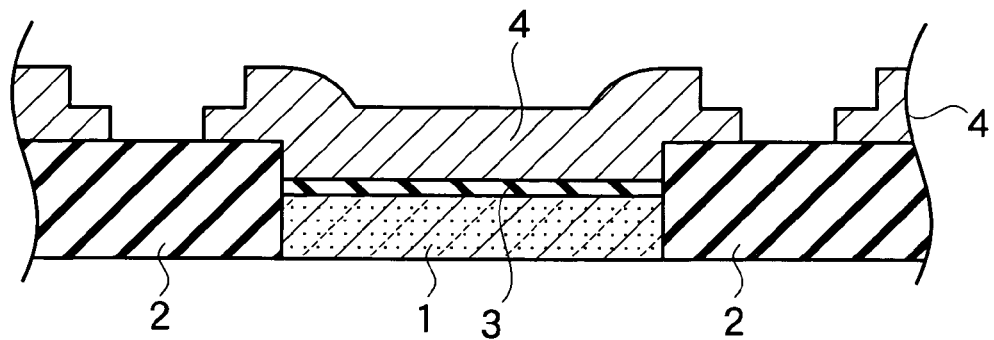
FIG. 21 is a schematic device cross-sectional diagram for describing a step of the nonvolatile semiconductor memory fabrication method according to the second embodiment of the present invention.

As shown in FIG. 21, the first mask material 5 and the second mask material 7 are removed. At this time, the thermal oxide films 20 are removed as well as the first mask material 5 and the second mask material 7, so as to form steps.

Figure 22:
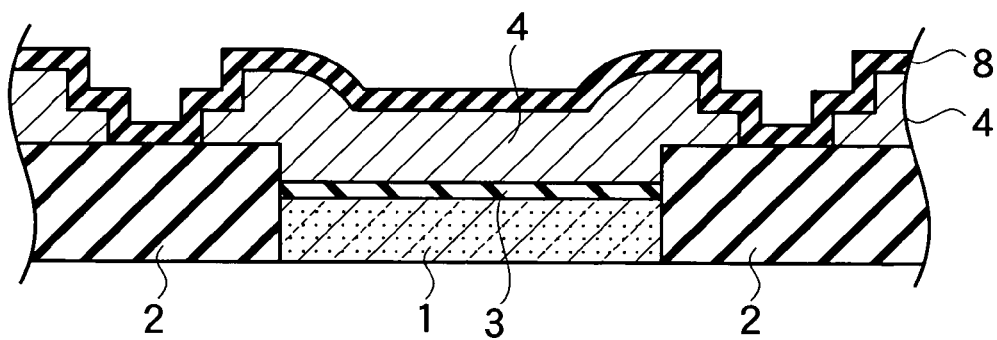
FIG. 22 is a schematic device cross-sectional diagram for describing a step of the nonvolatile semiconductor memory fabrication method according to the second embodiment of the present invention.

An inter-gate insulator film 8 is deposited as shown in FIG. 22.

Figure 23:
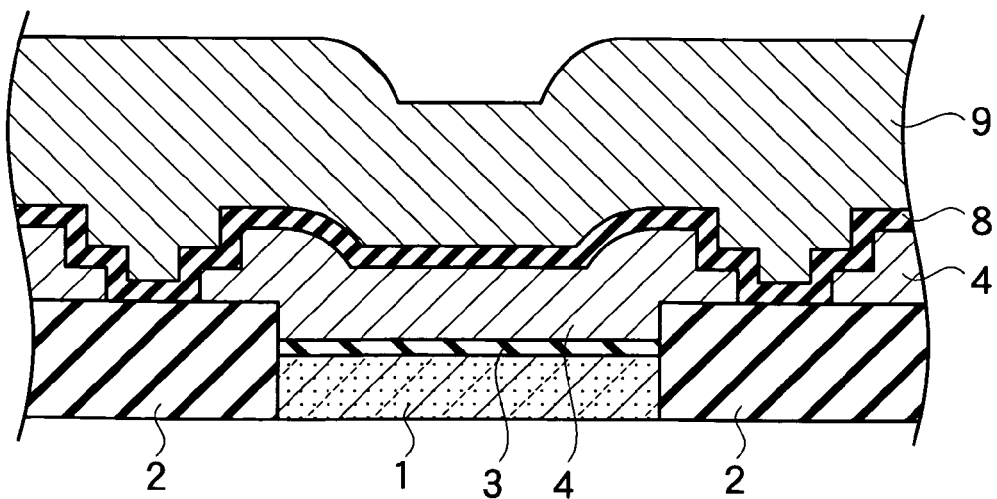
FIG. 23 is a schematic device cross-sectional diagram for describing a step of the nonvolatile semiconductor memory fabrication method according to the second embodiment of the present invention.

A control gate insulator electrode 9 is then deposited as shown in FIG. 23.

Since the edges of the floating gate electrode become steps according to the structure of the nonvolatile semiconductor memory according to the second embodiment, as with the first embodiment, the same characteristics as with the nonvolatile semiconductor memory according to the first embodiment can be attained.

THIRD EMBODIMENT

Figure 25:
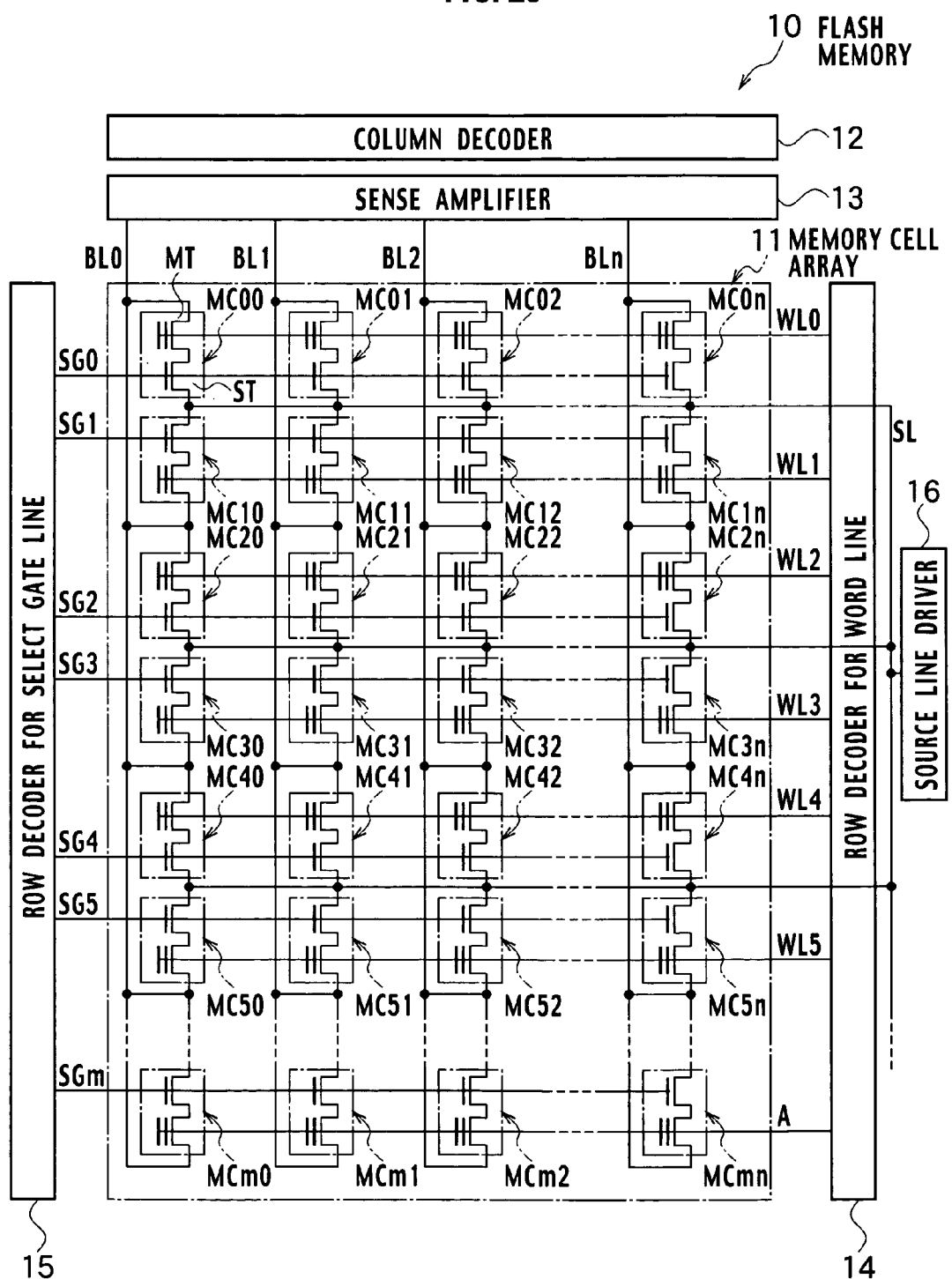
FIG. 25 is a circuit block diagram of nonvolatile semiconductor memory according to a third embodiment of the present invention, which is applied to the nonvolatile semiconductor memory of the first and the second embodiment of the present invention.

A circuit block diagram of a nonvolatile semiconductor memory according to the third embodiment of the present invention, which is applied to the nonvolatile semiconductor memory of the first and the second embodiment, is shown in FIG. 25. A memory cell array 11 of FIG. 25 corresponds to an expanded version of the planar pattern shown in FIG. 2 in that the basic structure of memory cells MC00 to MCnm has a two-transistor cell structure. As a modified example of the two-transistor cell structure, a three-transistor cell structure where a select transistor ST is connected to a source and a drain on both sides of a single memory cell transistor MT may easily be expanded from the planar pattern given in FIG. 2.

An exemplary circuit structure of the nonvolatile semiconductor memory according to the third embodiment of the present invention is described as an exemplary two-transistor cell structure, as shown in FIG. 25.

As shown in the drawing, flash memory 10 includes the memory cell array 11, a column decoder 12, a sense amplifier 13, a first row decoder 14, a second row decoder 15, and a source line driver 16.

The memory cell array 11 has multiple memory cell ((m+1)×(n+1), where m and n are natural numbers) MC00 to MCnm arranged in a matrix. Each memory cell MC has a memory cell transistor MT and a select transistor ST, and current paths thereof are serially connected. The memory cell transistor MT has a stacked gate structure including a floating gate formed between gate insulator films on the semiconductor substrate, and a control gate formed between inter-gate insulator films on the floating gates. The source region of the memory cell transistor MT is connected to the drain region of the select transistor ST. Furthermore, adjacent memory cells MC in the column direction share the source region of the select transistor ST and the drain region of the memory cell transistor MT.

The control gates of the memory cell transistors MT of memory cells MC in the same row are connected in common to one of word lines WL0 to WLm, and the gates of the select transistors ST of the memory cells in the same row are connected to one of select gate lines SG0 to SGm. In addition, the drains of memory cell transistors MT of memory cells MC in the same column are connected in common to one of bit lines BL0 to BLn. The sources of select transistors ST of memory cells MC are connected in common to the source line SL, and are connected to the source line driver 16.

The column decoder 12 decodes a column address signal and outputs a column address decode signal. One of the bit lines BL0 to BLn is selected based on the column address code signal.

The first and the second row decoders 14 and 15 decode a row address signal and output a row address decode signal. The first row decoder 14 selects one of world lines WL0 to WLm at the time of write-in. The second row decoder 15 selects one of select gate lines SG0 to SGm at the time of read-out.

The sense amplifier 13 amplifies data read out from the memory cell MC selected by the second row decoder 15 and the column decoder 12.

The source line driver 16 supplies a voltage to the source line SL at the time of read-out.

According to the structure of the nonvolatile semiconductor memory according to the third embodiment, which is applied to the nonvolatile semiconductor memory according to the first and the second embodiment of the present invention, by combining advantages of both NOR flash memory and NAND flash memory, and making the maximum vertical thickness of the inter-gate insulator film 8 smaller, flash memory with improved production yield can be implemented.

FOURTH EMBODIMENT

Figure 26:
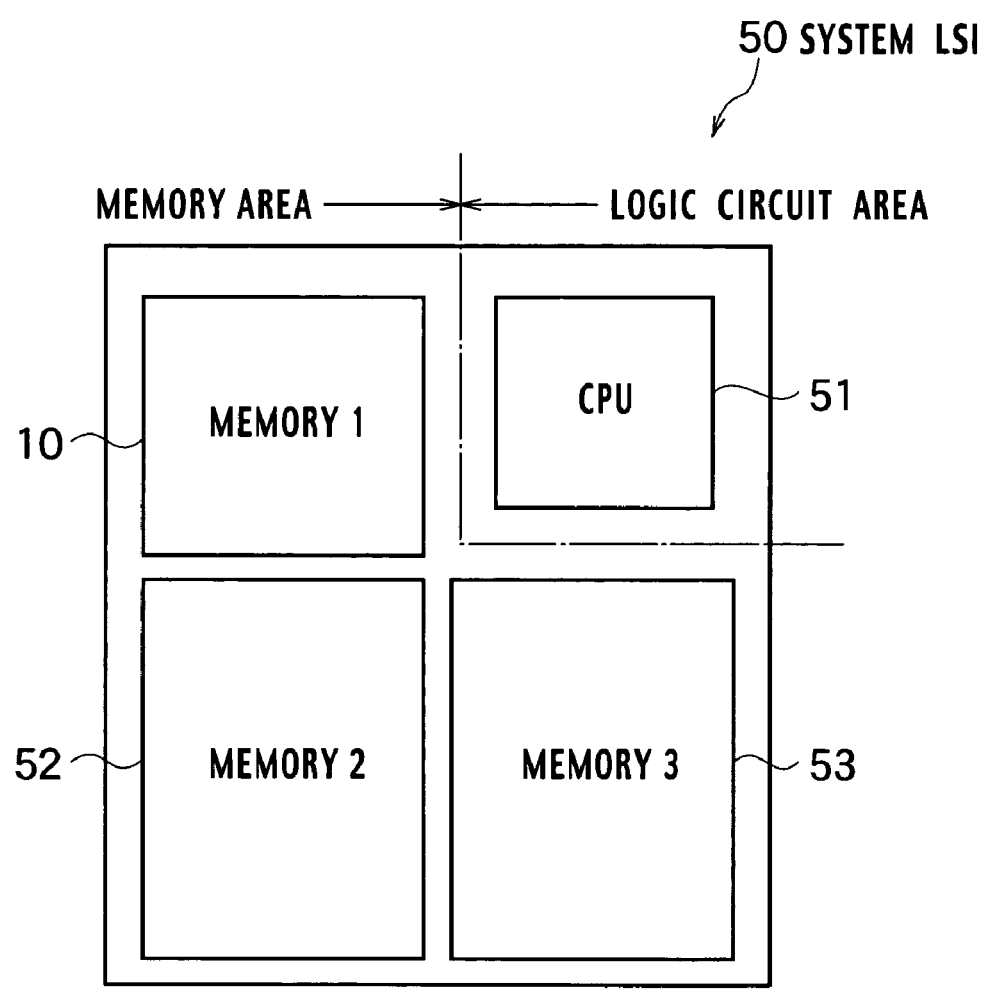
FIG. 26 is a block diagram of a system LSI including the nonvolatile semiconductor memory, according to the first through third embodiments of the present invention, which is a nonvolatile semiconductor memory according to a fourth embodiment of the present invention.

The nonvolatile semiconductor memory according to the fourth embodiment of the present invention is described with reference to FIG. 26. FIG. 26 is a block diagram of a system LSI including the nonvolatile semiconductor memory according to this embodiment.

As shown in the drawing, a system LSI 50 has a logic circuit area and a memory area. The logic circuit area is provided with a CPU 51, for example. In addition, the memory area is provided with the flash memory 10, which has been described with the first through third embodiments, NAND flash memory 52, and flash memory 53, which has a three-transistor cell structure in which a memory cell includes three MOS transistors.

The structure of the nonvolatile semiconductor memory according to the fourth embodiment of the present invention simplifies the system LSI structure. In particular, in the case of applying the nonvolatile semiconductor memory according to the third embodiment of the present invention, a memory cell has a series of two transistors. Accordingly, the memory cell current-driving capability is greater than that of other memory cells. As a result, the flash memory 10 is suitable for high-speed read-out. When mounted on the same chip as the CPU 51 as shown in FIG. 26, the flash memory 10 may be utilized as a ROM for storing firmware or the like for the CPU 51. As a result, in the case of configuring the flash memory 10 according to the nonvolatile semiconductor device of the first through third embodiments of the present invention, the select gate line may be driven at a high speed, and the resistance of the source line SL may be reduced. Accordingly, data can be read out more quickly from the flash memory 10. As a result, since the CPU 51 can read out data directly and not via a RAM or the like, a RAM is omitted.

In the nonvolatile semiconductor memory according to the fourth embodiment of the present invention, the NAND flash memory 52 and the flash memory 53 can be formed in the same fabrication process. In other words, the nonvolatile semiconductor memory fabrication method according to the first embodiment of the present invention shown in FIGS. 11 through 16, or the nonvolatile semiconductor memory fabrication method according to the second embodiment of the present invention shown in FIGS. 17 through 23 may be used. For example, ion implantation for formation of impurity diffused layers, patterning of gate electrodes and metallic interconnect layers, and the like may be carried out simultaneously for three flash memories. In this case, for example, the impurity diffused layers have the same concentration between each memory. As a result of forming the three flash memories in a system LSI using the same process, the system LSI structure can be simplified.

OTHER EMBODIMENTS

As described above, the present invention is described according to the first through fourth embodiments; however, it should not be perceived that descriptions and drawings forming a part of this disclosure are intended to limit the spirit and scope of the present invention. Various alternative embodiments and operational techniques will become apparent from this disclosure for those skilled in the art.

As such, the present invention naturally includes various embodiments not described herein. Accordingly, the technical range of the present invention is determined only by specified features of the invention according to the above-mentioned descriptions and appropriate appended claims.

What is claimed is:
1. A nonvolatile semiconductor memory comprising:
a plurality of stripe-shaped active regions extending in a bit line direction;
device isolation regions having tops thereof arranged at a location higher than the active regions;
a plurality of word lines and select gate lines intersecting with the bit line direction; and
memory cell transistors arranged at the intersections of the active regions and the word lines via gate insulator films, comprising floating gate electrodes formed on the device isolation regions and gate insulator films on the active regions, and isolated on the device isolation regions, control gate electrodes arranged on the floating gate electrodes, and inter-gate insulator films arranged between the control gate electrodes and the floating gate electrodes;
wherein the thickness of the floating gate electrodes on the active regions and a maximum thickness of the floating gate electrodes on the device isolation regions are substantially the same, and steps are provided at the edges of the floating gate electrodes isolated on the device isolation regions,
the floating gate electrodes have steps half the maximum thickness of the floating gate electrodes, and
the steps at the edges of the floating gate electrodes isolated on the device isolation regions have a length in a direction parallel to the word lines for the floating gate electrodes which is greater than the thickness of the inter-gate insulator films.

2. The nonvolatile semiconductor memory of claim 1, wherein the floating gate electrodes are polysilicon films.

3. The nonvolatile semiconductor memory of claim 1, wherein the thickness of the floating gate electrodes on the active regions and the maximum thickness of the floating gate electrodes on the device isolation regions are substantially the same.

4. The nonvolatile semiconductor memory of claim 1 further comprising: select transistors arranged at the intersections of the active regions and select gate lines via the gate insulator films, comprising floating gate electrodes formed on the device isolation regions and the gate insulator films on the active regions, and isolated on the device isolation regions, and control gate electrodes arranged on the floating gate electrodes and electrically connected thereto.

5. The nonvolatile semiconductor memory of claim 4, wherein each select transistor and corresponding memory cell transistor are serially connected via an active region in the bit line direction.

6. The nonvolatile semiconductor memory of claim 4, wherein each select transistor and corresponding memory cell transistor are serially connected via an active region in the bit line direction, configuring a two-transistor memory cell.

7. The nonvolatile semiconductor memory of claim 4, wherein each select transistor and corresponding memory cell transistor are serially connected via an active region in the bit line direction, configuring a three-transistor memory cell.

8. The nonvolatile semiconductor memory of claim 1, wherein a vertical thickness of the inter-gate insulator films at the edges of the floating gate electrodes isolated on the device isolation regions, which are in contact with the floating gate electrodes, is equal to the sum of half the maximum thickness of the floating gate electrodes on the device isolation regions and the thickness of the inter-gate insulator films.

9. The nonvolatile semiconductor memory of claim 8, wherein the floating gate electrodes have step portions which are half the maximum thickness of the floating gate electrodes.

10. The nonvolatile semiconductor memory of claim 8, wherein the floating gate electrodes have step portions with a length that is parallel to the word lines for the floating gate electrodes and is greater than the thickness of the inter-gate insulator films.

11. The nonvolatile semiconductor memory of claim 8, wherein the floating gate electrodes are polysilicon films.

12. The nonvolatile semiconductor memory of claim 8, wherein the thickness of the floating gate electrodes on the active regions and the maximum thickness of the floating gate electrodes on the device isolation regions are substantially the same.

13. The nonvolatile semiconductor memory of claim 8 further comprising: select transistors arranged at the intersections of the active regions and select gate lines via the gate insulator films, comprising floating gate electrodes formed on the device isolation regions and the gate insulator films on the active regions, and isolated on the device isolation regions, and control gate electrodes arranged on the floating gate electrodes and electrically connected thereto.

14. The nonvolatile semiconductor memory of claim 13, wherein each select transistor and corresponding memory cell transistor are serially connected via an active region in the bit line direction.

15. The nonvolatile semiconductor memory of claim 13, wherein each select transistor and corresponding memory cell transistor are serially connected via an active region in the bit line direction so as to configure a three-transistor memory cell.

16. A nonvolatile semiconductor memory comprising:
a plurality of stripe-shaped active regions extending in a bit line direction;
shallow trench isolation regions having tops thereof arranged at a location higher than the active regions;
a plurality of word lines and select gate lines intersecting with the bit line direction; and
memory cell transistors arranged at the intersections of the active regions and the word lines via gate insulator films, comprising floating gate electrodes formed on the shallow trench isolation regions and gate insulator films on the active regions, and isolated on the shallow trench isolation regions, control gate electrodes arranged on the floating gate electrodes, and inter-gate insulator films arranged between the control gate electrodes and the floating gate electrodes;
wherein:
the thickness of the floating gate electrodes on the active regions and a maximum thickness of the floating gate electrodes on the shallow trench isolation regions are substantially the same, and steps are provided at the edges of the floating gate electrodes isolated on the shallow trench isolation regions,
the floating gate electrodes have steps half the maximum thickness of the floating gate electrodes, and
the steps at the edges of the floating gate electrodes isolated on the shallow trench isolation regions have a length in a direction parallel to the word lines for the floating gate electrodes which is greater than the thickness of the inter-gate insulator films.

17. The nonvolatile semiconductor memory of claim 16, wherein the thickness of the floating gate electrodes on the active regions is thicker than the value of the height from the top surface of the shallow trench isolation regions to the surface of the gate insulator films on the active regions.

* * * * *